United States Patent [19]
Hardy et al.

[11] Patent Number: 5,942,995
[45] Date of Patent: Aug. 24, 1999

[54] RETURN-TO-ZERO RECEIVER

[75] Inventors: Steven P. Hardy, La Mesa, Calif.;
James T. Doyle, Chandler, Ariz.

[73] Assignee: Intel Corporation, Santa Clara, Calif.

[21] Appl. No.: 09/000,598

[22] Filed: Dec. 30, 1997

[51] Int. Cl.$^6$ ...................................................... H03M 5/04

[52] U.S. Cl. ............................................................. 341/68

[58] Field of Search .................................. 341/68, 73, 69, 341/70, 71

[56] References Cited

U.S. PATENT DOCUMENTS 4,556,868  12/1985  Harle ........................................... 341/73

*Primary Examiner*—Brian Young
*Attorney, Agent, or Firm*—Trop, Pruner, Hu & Miles, P.C.

[57] ABSTRACT

A return-to-zero (RZ) receiver is constructed to receive at least two pulses which are distinguishable. The receiver includes two single stage amplifiers. Each different single state amplifier receives a different one of the two pulses and generate signals in response. A summer of the receiver generates an output signal by summing the signals that are generated by the single stage amplifiers.

32 Claims, 3 Drawing Sheets

RETURN-TO-ZERO RECEIVER

BACKGROUND INFORMATION

The invention relates to a return-to-zero receiver.

Referring to FIG. 1, quite often digital circuits 10 and 12 need to communicate with each other. For example, the circuit 10 might send digital bits to the circuit 12 over a communication line 14. The circuits 10 and 12 might be directly connected together. However, to avoid ground loops and DC mismatches between the two circuits 10 and 12, DC blocking elements, such as transformers or capacitors, might be used to couple the communication line 14 to the circuits 10 and 12.

In this manner, a capacitor 16 may be used to prevent the DC bias voltages of the circuits 10 and 12 from reaching the communication line 14. However, in doing so, the capacitor 16 removes the average, or DC, component of the stream of bits that is furnished by the circuit 10. As a result, the circuit 12 may encounter difficulties in recovering bits from the communication line 14 as the logic one and logic zero threshold voltages may not be constant. To avoid these difficulties, the circuit 10 may encode the bits via a return-to-zero (RZ) encoding scheme so that the encoded bit stream furnished by the circuit 10 does not have a DC component.

Referring also to FIG. 2, when RZ encoding is used, each logic one bit 27 is encoded into a pair of pulses: a positive going RZ pulse 24 and a negative going RZ pulse 26. The two RZ pulses 24 and 26 are complementary so that each pair of pulses does not disturb the DC level of the encoded bit stream. As a result, constant threshold voltage levels are used to detect the positive 24 and negative 26 going RZ pulses and thus, decode the bits.

An RZ transmitter 20 (see FIG. 1) of the circuit 10 encodes the positive edge of the bit 27 into the positive going RZ pulse 24 and encodes the negative edge of the bit 27 into the negative going RZ pulse 26. An RZ receiver 22 of the circuit 12 receives and decodes the RZ pulses 24 and 26 to form the bit 27.

If RZ encoding is used for a set of communication lines, such as a bus, an RZ transmitter and receiver pair is fabricated for each line of the bus. As a result, the size of the transmitters/receivers and the power consumed by the transmitters/receivers may present difficulties.

Thus, there is a need for an RZ receiver that improves one or more of the size, response time and power consumption of such system.

SUMMARY OF THE INVENTION

In one embodiment, the invention is generally directed to using single stage amplifiers to form a return-to-zero receiver.

Generally, in another embodiment, the invention features a return-to-zero receiver for receiving at least two pulses which are distinguishable. The receiver includes two single stage amplifiers. Each different single stage amplifier receives a different one of the two pulses and generate signals in response. A summer of the receiver generates an output signal by summing the signals that are generated by the single stage amplifiers.

Generally, in another embodiment, the invention features a return-to-zero receiver for receiving a positive going pulse and a negative going pulse. The receiver includes an NMOS transistor that is coupled in a common gate configuration and generates a signal in response to the negative going pulse. The receiver also includes a PMOS transistor that is coupled in a common gate configuration and generates another signal in response to the positive going pulse. A current mirror of the receiver receives the signal that is generated by the NMOS transistor, and another current mirror of the receiver receives the signal that is generated by the PMOS transistor. The two current mirrors interact to furnish an output signal.

Generally, in another embodiment, the invention features a method for decoding pulses which are distinguishable. The method includes using a first single stage amplifier to generate a first signal in response to one of the pulses. A second single stage amplifier is used to generate another signal in response to the other pulse. The first and second signals are combined to generate an output signal.

Other advantages and features will become apparent from the following description and from the claims.

DESCRIPTION

Figure 3:
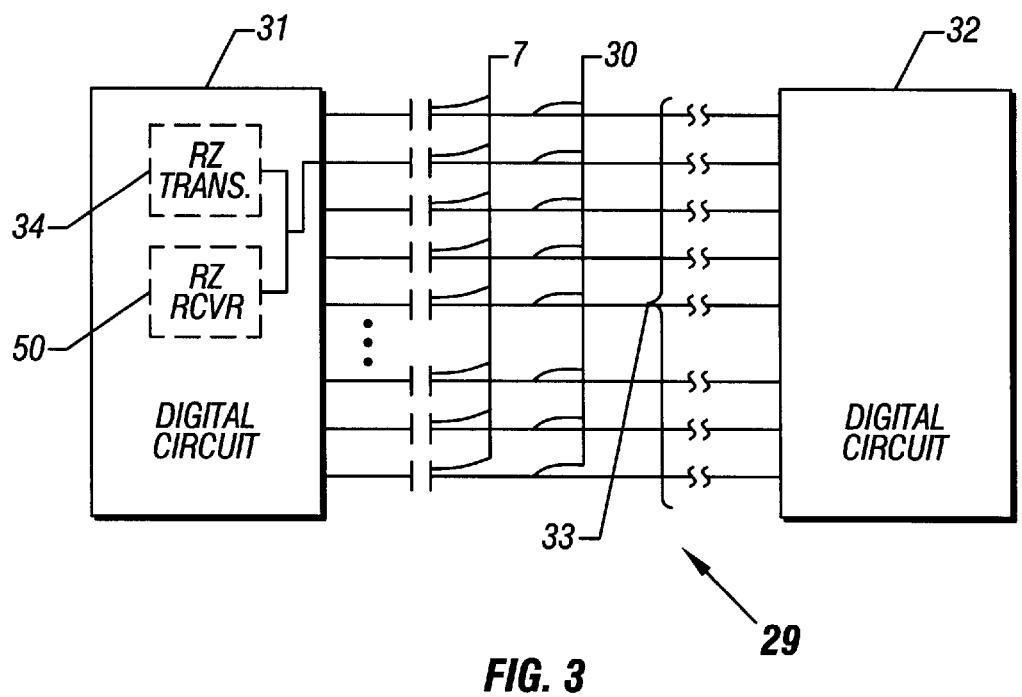
FIG. 3 is a schematic diagram of a system that uses return-to-zero encoding according to an embodiment of the invention.

Referring to FIG. 3, in a system 29, two circuits 31 and 32 use return-to-zero (RZ) encoding to communicate with each other over a bus 33. In this manner, for each bit line 30 of the bus 33, each circuit 31, 32 has an RZ transmitter 34 and an RZ receiver 50. If RZ encoding is not used to encode the data being transmitted over the bus 33, relatively large capacitors (e.g., 100 picofarads or more) might be needed to decouple the lines 30 of the bus 33 from the circuits 31 and 32. Otherwise, without these large capacitors, the capacitors might attenuate the unencoded data.

Figure 1:
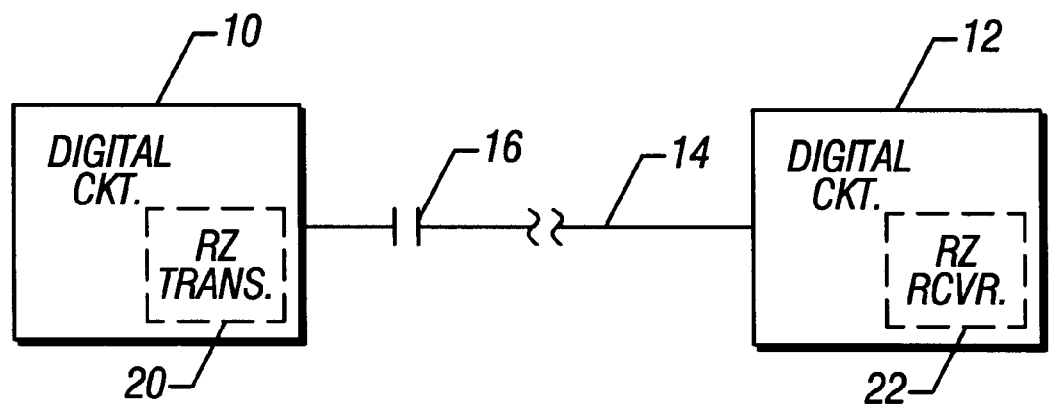
FIG. 1 is a schematic diagram of a conventional communication system for two circuits.
Figure 2:
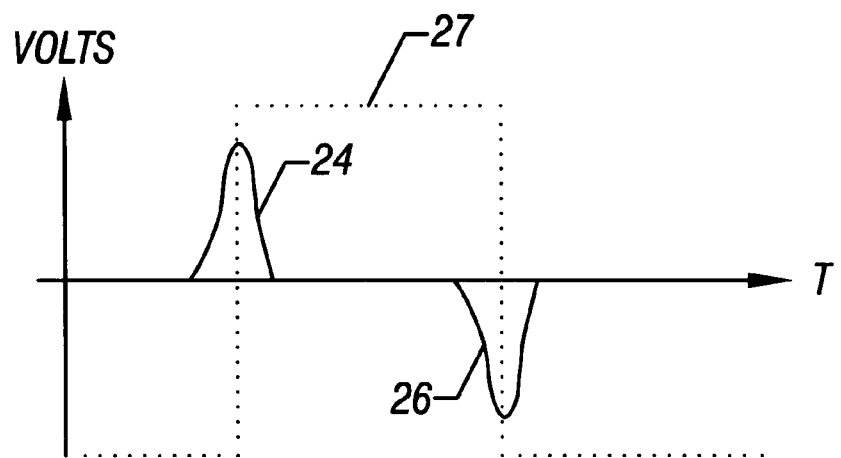
FIG. 2 is a waveform illustrating return-to-zero encoding.

However, because RZ encoding is used, the data is encoded into positive 24 and negative 26 (see FIG. 2) going pulses which have a relatively high frequency content, as compared to bits of unencoded data, for example. As a result, smaller and less expensive capacitors 7 (e.g., 32 picofarad capacitors) may be used to decouple the two circuits 31 and 32 from the lines 30 of the bus 33. Furthermore, with RZ encoding, the encoded data may be transferred at a higher rate across a capacitively coupled bus. As a result, the capacitively coupled bus might be, for example, an accelerated graphics port (AGP) bus capable of transferring data at a high frequency (e.g., 266 MHz).

Figure 4:
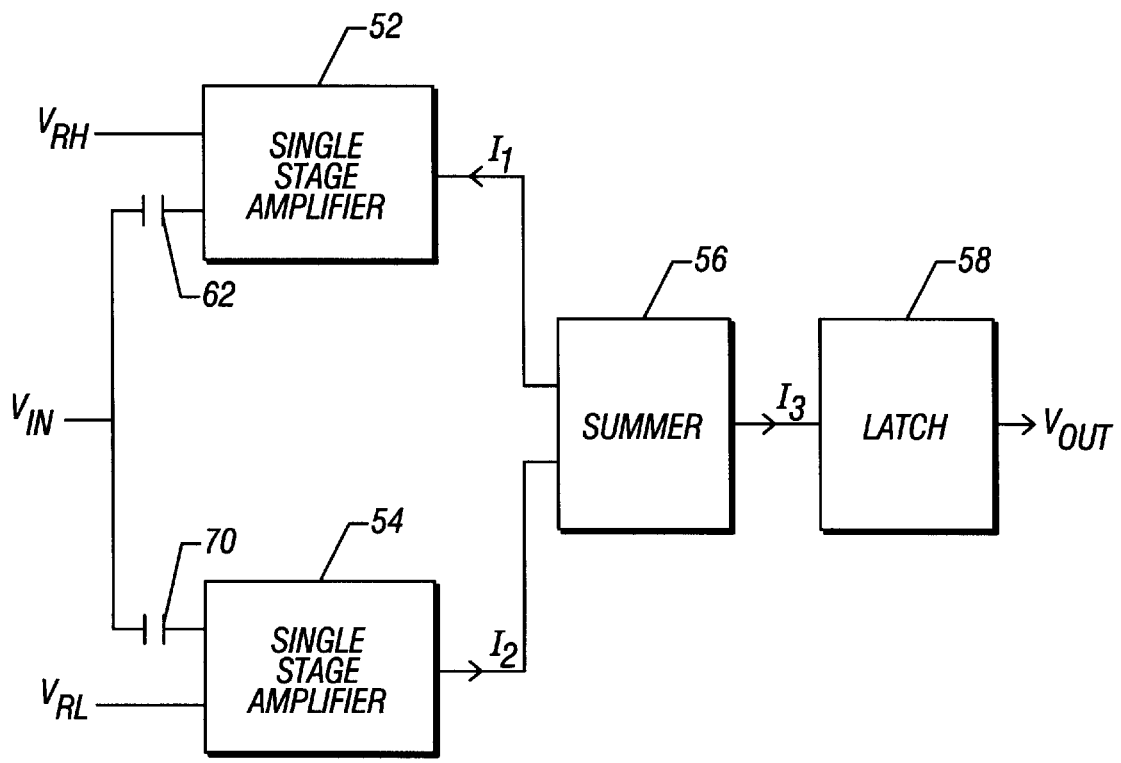
FIG. 4 is a schematic diagram of a return-to-zero receiver of the system of FIG. 3.

Besides the small capacitors 7, the system 29 has other features that reduce the cost and circuit area of the system 29. For example, referring to FIG. 4, each RZ receiver 50 of the system 29 is formed from single stage amplifiers, such as single stage amplifiers 52 and 54. In this context, the term "single stage" refers to the use of one of the many types of stages that are used in conventional amplifier design. For example, the term "single stage" includes configurations where a transistor is coupled in a common base, common emitter, common gate or common source configuration. The term "single stage" also includes, for example, a differential amplifier stage which includes two transistors that are coupled in a differential arrangement.

The advantages of using single stage amplifiers to form a return-to-zero receiver may include one or more of the following. Less die area may be consumed. Overall power consumption may be decreased, standby power dissipation may be decreased, and response time may be decreased.

Both amplifiers 52 and 54 are coupled (via capacitors 62 and 70) to receive an input signal (called $V_{IN}$) and are constructed to respond in a complementary manner to positive and negative going RZ pulses that are present in the $V_{IN}$ signal. In this manner, the amplifier 52 responds to a positive going RZ pulse 24 (see FIG. 2), and the amplifier 54 responds to a negative going RZ pulse 26.

A summer 56 algebraically sums two current signals (called $I_1$ and $I_2$) to form a current signal (called $I_3$) that is used to control the state of a latch 58. The latch 58, in turn, is constructed to generate a digital voltage output signal (called $V_{OUT}$) that is representative of the decoded bits 27 (see FIG. 2) and is provided to one of the bit lines 30 of the bus 33. The single stage amplifier 52 furnishes the $I_1$ signal which removes current from the summer 56, and the single stage amplifier 54 furnishes the $I_2$ signal which supplies current to the summer 56. As a result of this complementary arrangement, when the magnitudes of the signals $I_1$ and $I_2$ are substantially equal to each other, the $I_3$ signal has a magnitude near zero.

The $I_3$ signal has a positive orientation in a direction from the summer 56 to the latch 58. When the magnitude of the $I_3$ signal is substantially greater than zero, the latch 58 drives the $V_{OUT}$ signal low. When the magnitude of the $I_3$ signal is substantially less than zero, the latch 58 drives the $V_{OUT}$ signal high. Otherwise, when the magnitude of the $I_3$ signal is near zero (i.e., when the magnitudes of the two signals $I_1$ and $I_2$ are substantially equal), the latch 58 maintains the state of the $V_{OUT}$ signal. The latch 58 also aids in shaping the $V_{OUT}$ signal, as described below.

The amplifier 52 recognizes the positive going pulse 24 by determining when the magnitude of the $V_{IN}$ signal exceeds a bias voltage level (called $V_{RH}$). The amplifier 52 recognizes the negative going pulse 26 by determining when the magnitude of the $V_{IN}$ signal falls below another bias voltage level (called $V_{RL}$). In other embodiments, techniques other than level detection may be used to recognize the positive 24 and negative 26 going pulses.

Therefore, the single stage amplifiers 52 and 54 selectively adjust the magnitudes of the current signals $I_1$ and $I_2$ in response to the positive 24 and negative 26 going RZ pulses. These adjustments, in turn, drive the $V_{OUT}$ signal which represents the decoded bits 27.

Figure 5:
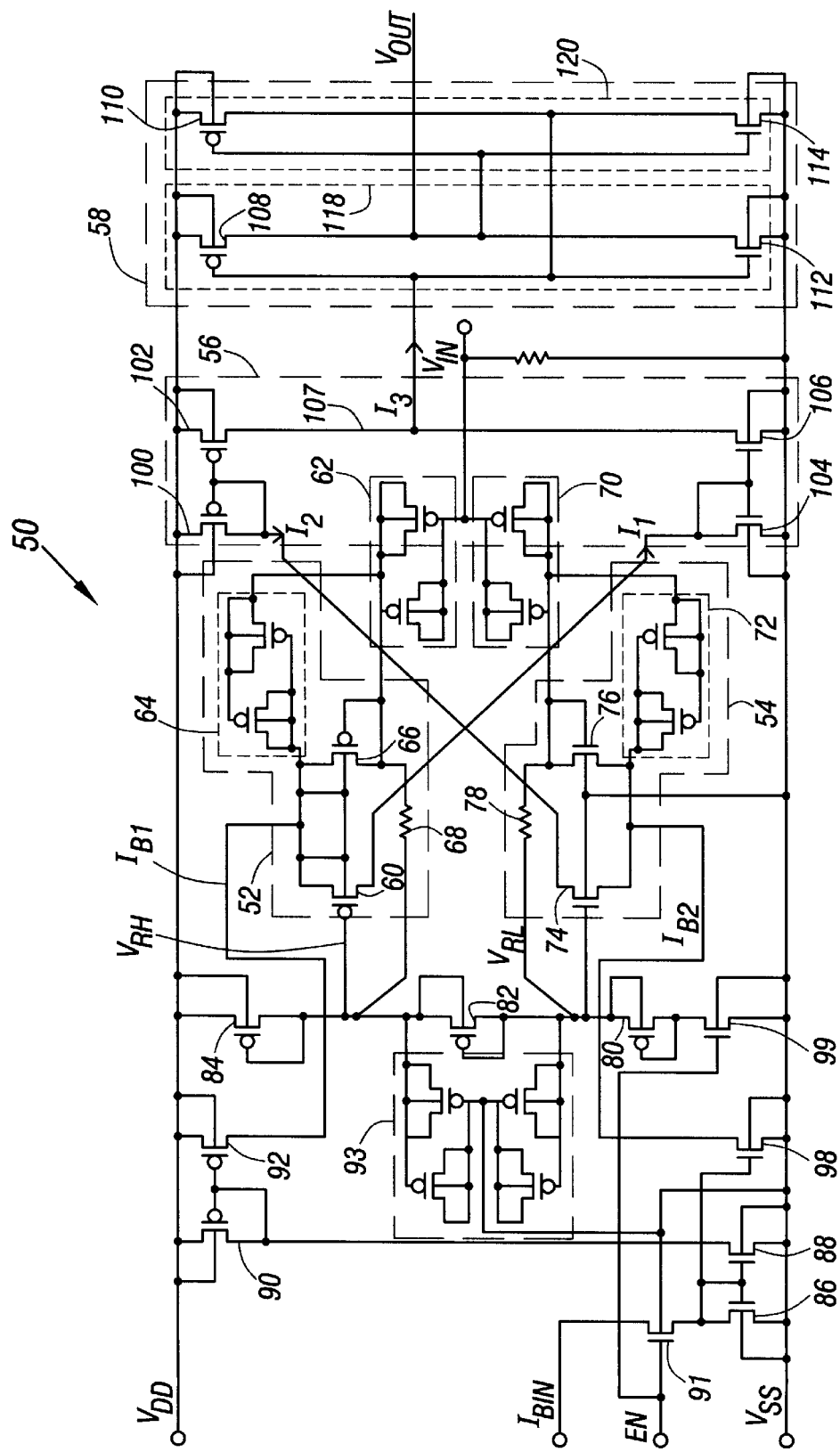
FIG. 5 is a more detailed schematic diagram of the receiver of FIG. 4.

Many embodiments are possible for the single stage amplifiers. As an example, referring to FIG. 5, the amplifier 52 includes a p-channel metal-oxide-semiconductor (PMOS) transistor 60 that is coupled in a common gate configuration. In this manner, the source of the transistor 60 receives a representation of the $V_{IN}$ signal and uses this representation to detect the positive going RZ pulse 24 and generate the $I_1$ signal.

The bias currents and voltages of the transistor 60 are established via a bias current (called $I_{B1}$), the bias voltage level $V_{RH}$, a PMOS transistor 66 and a resistor 68. The $I_{B1}$ current flows through the source-drain path of the transistor 60 and through a path which includes the source-drain path of the transistor 66 and the resistor 68. The source of the transistor 66 is coupled to the source of the transistor 60, and the gate of the transistor 66 is coupled to the drain of the transistor 66 which places the transistor 66 in a "diode configuration." The drain of the transistor 66 is serially coupled to the $V_{RH}$ voltage level through the resistor 68.

The transistor 66 and the resistor 68 are bias elements which establish the bias current flowing through the transistor 60 and the voltage level of the source of the transistor 60. In some embodiments, about 80% of the $I_{B1}$ current flows through the source-drain path of the transistor 60, and the remaining 20% of the $I_{B1}$ current flows through the source-drain path of the transistor 66. As a result, reserve current is present in the transistor 66 when the positive going RZ pulse 24 arrives. In some embodiments, the transistors 60 and 66 are designed to form a "matched pair."

The $V_{IN}$ signal is coupled to the source of the transistor 60 through the capacitor 62 (formed from two PMOS transistors, for example) and a capacitor 64 (formed from two PMOS transistors, for example). The capacitor 62 decouples any DC component of the $V_{IN}$ signal from the rest of the receiver 50. The capacitor 64 functions as a battery to hold the gate-source voltage of the transistor 66 substantially constant when the receiver 50 receives the positive going RZ pulse 24.

The capacitor 62 has one terminal that receives the $V_{IN}$ signal and one terminal that is coupled to the gate (and drain) of the transistor 66. The capacitor 64 is coupled in parallel with the gate and source of the transistor 66.

The amplifier 54 includes an n-channel metal-oxide-semiconductor (NMOS) transistor 74 that is coupled in a common gate configuration. In this manner, the source of the transistor 74 receives a representation of the $V_{IN}$ signal. The transistor 74 uses this representation to detect the negative going RZ pulse 26 and generate the $I_2$ signal.

The bias currents and voltages of the transistor 74 are established via a bias current (called $I_{B2}$), the bias voltage level $V_{RL}$, an NMOS transistor 76 and a resistor 78. The $V_{RL}$ voltage level is received by the gate of the transistor 76 and effectively sets the threshold voltage $V_{TL}$ level which is slightly lower than the voltage level $V_{RL}$. A capacitor 93 (formed from PMOS transistors, for example) is coupled between the $V_{RH}$ and $V_{RL}$ voltage levels.

The $I_{B2}$ current flows through the drain-source path of the transistor 74 and through a path which includes the drain-source path of the transistor 76 and the resistor 78. The source of the transistor 76 is coupled to the source of the transistor 74. The gate of the transistor 76 is coupled to the drain of the transistor 76 which places the transistor 76 in a "diode configuration." The drain (and gate) of the transistor 76 is serially coupled to the $V_{RL}$ voltage level through the resistor 78.

The transistor 76 and the resistor 78 are bias elements which establish the bias current flowing through the transistor 74 and the voltage level of the source of the transistor 74. In some embodiments, about 80% of the $I_{B2}$ current flows through the drain-source path of the transistor 74, and the remaining 20% of the $I_{B2}$ current flows through the drain-source path of the transistor 76. As a result, reserve current is present in the transistor 76 when the receiver 50 receives the negative going RZ pulse 26. In some embodiments, the transistors 74 and 76 are designed to form a "matched pair."

The $V_{IN}$ signal is coupled to the source of the transistor 74 through the capacitor 70 (formed from two PMOS transistors, for example) and a capacitor 72 (formed from two PMOS transistors, for example). The capacitor 70 decouples any DC component of the $V_{ID}$ signal from the rest of the receiver 50. The capacitor 72 functions as a battery to hold the gate-source voltage of the transistor 76 nearly constant when the receiver 50 receives the negative going RZ pulse 26.

The capacitor 70 has one terminal that receives the $V_{IN}$ signal and one terminal that is coupled to the gate (and drain) of the transistor 76. The capacitor 72 is coupled in parallel with the gate and source of the transistor 76.

The summer 56 includes a current mirror formed from an NMOS transistor 104 and an NMOS transistor 106. To accomplish this, the gate and drain of the transistor 104 and the gate of the transistor 106 are all coupled together. As a result, the current flowing through the drain-source path of the transistor 104 is mirrored in the drain-source path of the transistor 106.

In some embodiments, the aspect ratio of the transistor 106 is larger than the aspect ratio of the transistor 104 SO that current amplification is achieved. For example, in some embodiments, the aspect ratio of the transistor 106 is two times larger than the aspect ratio of the transistor 104.

The drain of the transistor 104 is coupled to the drain of the transistor 60 and thus, receives the $I_1$ signal. The sources of the transistors 104 and 106 are coupled to the $V_{SS}$ voltage level, and the drain of the transistor 106 is coupled to a node 107.

In this manner, when the amplifier 52 receives a positive going pulse 24, the amplifier 52 substantially increases the magnitude of the $I_1$ signal over its bias value which pulls the voltage of the node 107 near the $V_{SS}$ supply voltage level. Also, during reception of the positive going pulse 24, the magnitude of the $I_3$ signal falls substantially below zero which causes the latch 58 to drive the $V_{OUT}$ signal high, as described below. When the positive going pulse 24 is not being received, the amplifier 52 allows the magnitude of the $I_1$ signal to approach its bias value. For this case, the voltage level of the node 107 is dependent on other factors, described below.

The summer 56 also includes a current mirror formed from a PMOS transistor 100 and a PMOS transistor 102. To accomplish this, the gate and drain of the transistor 100 and the gate of the transistor 102 are all coupled together. As a result, the current flowing through the source-drain path of the transistor 100 is mirrored in the source-drain path of the transistor 102.

In some embodiments, the aspect ratio of the transistor 102 is larger than the aspect ratio of the transistor 100 so that current amplification is achieved. For example, in some embodiments, the aspect ratio of the transistor 102 is two times larger than the aspect ratio of the transistor 100.

The drain of the transistor 100 is coupled to the drain of the transistor 74 and thus, receives the $I_2$ signal. The sources of the transistors 100 and 102 are coupled to the $V_{DD}$ voltage level, and the drain of the transistor 102 is coupled to the node 107.

In this manner, when the amplifier 54 receives a negative going pulse 26, the amplifier 54 substantially increases the magnitude of the $I_2$ signal over its bias value which pulls the voltage of the node 107 near the $V_{DD}$ supply voltage level. When the amplifier 54 allows the magnitude of the $I_2$ signal to drop back to its bias level, the voltage of the node 107 is dependent on the magnitude of the $I_1$ signal. Thus, if the magnitude of the $I_1$ signal is substantially above its bias level, and the magnitude of the $I_2$ signal is near its bias level, the transistor 106 is fully turned on, and the transistor 102 is barely conducting. As a result, the voltage of the node 107 is pulled near the $V_{SS}$ supply voltage level.

If the magnitudes of both of the signals $I_1$ and $I_2$ are near their bias levels, a condition that indicates no pulses are present, the transistors 102 and 106 are both barely conducting which causes the voltage of the node 107 to be approximately midway between the voltage levels $V_{DD}$ and $V_{SS}$.

The latch 58 includes two CMOS inverters 118 and 120 that are coupled back-to-back to form a latch. In this manner, one CMOS inverter 118 is formed from a PMOS transistor 108 and an NMOS transistor 112. The input of the inverter 118 is coupled to the node 107, and output of the inverter 118 furnishes the $V_{OUT}$ signal.

The other CMOS inverter 120 is formed from a PMOS transistor 110 and an NMOS transistor 114. The output of the inverter 120 is coupled to the input of the inverter 118. The input of the inverter 120 receives the $V_{OUT}$ signal.

When the magnitude of the $I_3$ signal is substantially different from its bias level, the latch 58 sets the state of the $V_{OUT}$ signal accordingly. However, when the magnitude of the $I_3$ signal is neither high nor low (i.e., when the voltage level of the node 107 is approximately midway between the voltage levels $V_{DD}$ and $V_{SS}$), the latch 58 retains the previous state of the $V_{OUT}$ signal.

Among the other features of the receiver 50, the voltage levels $V_{RH}$ and $V_{RL}$ are furnished by a voltage divider that is formed from a string of PMOS transistors 80, 82 and 84 that are serially coupled between the voltage levels $V_{DD}$ and $V_{SS}$. The transistors 80, 82 and 84 are each coupled in a diode configuration, i.e., each transistor has its gate coupled to its drain. In this manner, the transistor 84 is coupled to the $V_{DD}$ supply voltage level; the transistor 82 is serially coupled to the transistor 84; and the transistor 80 is serially coupled to the transistor 82 and to the $V_{SS}$ supply voltage level.

The $V_{RH}$ voltage level is furnished by the drain of the transistor 84, and the $V_{RL}$ voltage level is furnished by the drain of the transistor 82. The $V_{RH}$ voltage level has is a predetermined amount above the midway point between the supply voltage levels $V_{DD}$ and $V_{SS}$. The $V_{RL}$ voltage level is the same predetermined amount below the midway point between the supply voltage levels $V_{DD}$ and $V_{SS}$.

The $I_{B1}$ current is furnished by a current mirror that is formed from two PMOS transistors 90 and 92. The gate of the transistor 90 is coupled to its drain and to the gate of the transistor 92, and the sources of the transistor 90 and 92 are coupled to the $V_{DD}$ supply voltage level. The drain of the transistor 92 furnishes the $I_{B1}$ current. The drain of the transistor 90 receives current from another current mirror that is formed from three NMOS transistors 86, 88 and 98.

The gate of the transistor 86 is coupled to its drain and to the gate of the transistor 88, and the sources of the transistors 86 and 88 are coupled to the $V_{SS}$ voltage level. The drain of the transistor 86 receives a bias current (called $I_{BIN}$).

The drain of the transistor 98 furnishes the $I_{B2}$ current. The gate of the transistor 98 is coupled to the gates of the transistors 86 and 88, and the source of the transistor 98 is coupled to the $V_{SS}$ supply voltage level.

An NMOS transistor 91 has its drain-source path coupled in series with the drain-source path of the transistor 82. The gate of the transistor 91 receives a signal (called EN) that is asserted to cause the transistor 91 to conduct and thus, enable the receiver 50. The EN signal is also received by the gate of an NMOS transistor 99 that has its drain-source path serially coupled between the source-drain path of the transistor 80 and the $V_{SS}$ voltage level. In this manner, when the EN signal is driven high, the transistor 99 conducts and the receiver 50 is enabled. Otherwise, the transistor 99 does not conduct, and as a result, the receiver 50 is disabled.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A return-to-zero receiver for receiving a positive going return-to-zero pulse and a negative going return-to-zero pulse, comprising:

first single stage amplifier configured to generate a first signal in response to the positive going return-to-zero pulse;

a second single stage amplifier configured to generate a second signal in response to the negative going return-to-zero pulse; and a summer configured to sum the first and second signals to generate an output signal.

2. The receiver of claim 1, wherein the first single stage amplifier comprises a transistor connected in a common base configuration.

3. The receiver of claim 2, wherein the first single stage amplifier further includes a second transistor connected to provide a bias voltage for the first transistor.

4. The receiver of claim 3, wherein the second transistor is connected in a diode configuration.

5. The receiver of claim 1, wherein the summer comprises:

a first current mirror connected to receive the first signal; and a second current mirror connected to receive the second signal and interact with the first current mirror to provide the output signal.

6. The receiver of claim 5, further comprising a latch connected to receive the output signal.

7. The receiver of claim 1, wherein the first single stage amplifier comprises a first transistor connected in a common base configuration, and the second single stage amplifier comprises a second transistor connected in a common base configuration.

8. The receiver of claim 7, further comprising:

a bias circuit configured to furnish a first bias voltage to a terminal of the first transistor and a second bias voltage to a terminal of the second transistor.

9. The receiver of claim 8, wherein the bias circuit comprises a plurality of third transistors having current paths serially coupled between two supply voltage levels.

10. The receiver of claim 9, wherein each of the third transistors is connected in a diode configuration.

11. The receiver of claim 7, wherein the first transistor comprises a PMOS transistor and the second transistor comprises an NMOS transistor.

12. A return-to-zero receiver for receiving a positive going pulse and a negative going pulse, comprising:

an NMOS transistor connected in a common gate configuration and configured to generate a first signal in response to the negative going pulse;

a PMOS transistor connected in a common gate configuration and configured to generate a second signal in response to the positive going pulse;

a first current mirror configured to receive the first signal; and a second current mirror connected to receive the second signal and interact with the first current mirror to furnish an output signal.

13. The receiver of claim 12, further comprising:

a bias circuit configured to furnish a first bias voltage to a terminal of the PMOS transistor and a second bias voltage to a terminal of the NMOS transistor.

14. The receiver of claim 13, wherein the bias circuit comprises a plurality of third transistors having current paths serially coupled between two voltage levels.

15. The receiver of claim 14, wherein each of the third transistors is connected in a diode configuration.

16. The receiver of claim 12, further comprising a latch connected to receive the output signal.

17. A method for decoding a positive going return-to-zero pulse and a negative going return-to-zero pulse, comprising:

using a first single stage amplifier to generate a first signal in response to the positive going return-to-zero pulse;

a second single stage amplifier to generate a second signal in response to the negative going return-to-zero pulse; and combining the first and second signals to generate an output signal.

18. The method of claim 17, wherein the act of using the first single stage amplifier comprises connecting a transistor in a common base configuration.

19. The method of claim 17, wherein act of using the first single state amplifier further includes connecting a second transistor to provide a bias voltage for the first transistor.

20. The method of claim 17, wherein the act of connecting further includes connecting the second transistor in a diode configuration.

21. The method of claim 17, wherein the act of combining comprises:

summing the first and second signals together.

22. The method of claim 17, further comprising latching the output signal.

23. The method of claim 17, wherein the act of using the first single stage amplifier comprises connecting a first transistor in a common base configuration, and the act of using the second single stage amplifier comprises connecting a second transistor in a common base configuration.

24. The method of claim 17, further comprising:

connecting a voltage divider between a supply voltage level and ground; and using the voltage divider to bias terminals of the first and second transistors.

25. The method of claim 24, wherein the first transistor comprises a PMOS transistor and the second transistor comprises an NMOS transistor.

26. The method of claim 17, wherein the combining includes:

using the first and second current mirrors to amplify the first and second signals.

27. A return-to-zero receiver for receiving a first pulse and a second pulse which are distinguishable, comprising:

a first single stage amplifier configured to generate a first signal in response to the first pulse;

a second single stage amplifier configured to generate a second signal in response to the second pulse;

a summer configured to sum the first and second signals to generate an output signal; and a latch connected to receive the output signal.

28. The receiver of claim 27, wherein the first single stage amplifier comprises a transistor connected in a common base configuration.

29. The receiver of claim 28, wherein the first single stage amplifier further includes a second transistor connected to provide a bias voltage for the first transistor.

30. The receiver of claim 29, wherein the second transistor is connected in a diode configuration.

31. The receiver of claim 27, wherein the first pulse comprises a positive going pulse and the second pulse comprises a negative going pulse.

32. The receiver of claim 27, wherein the summer comprises:

a first current mirror connected to receive the first signal; and a second current mirror connected to receive the second signal and interact with the first current mirror to provide the output signal.

* * * * *

UNITED STATES PATENT AND TRADEMARK OFFICE
CERTIFICATE OF CORRECTION

PATENT NO. : 5,942,995

DATED : 08/24/99

INVENTOR(S) : Steven P. Hardy and James T. Doyle

It is certified that error appears in the above-identified patent and that said Letters Patent is hereby corrected as shown below:

In col. 7, line 1, before the first occurrence of "first" insert --a--.

Signed and Sealed this

Fourth Day of January, 2000

Attest:

*Attesting Officer*

*Acting Commissioner of Patents and Trademarks*